United States Patent
Arndt et al.

(10) Patent No.: US 9,177,822 B2
(45) Date of Patent: *Nov. 3, 2015

(54) SELECTIVE ETCHING BATH METHODS

(75) Inventors: Russell Herbert Arndt, Fishkill, NY (US); Paul F. Findeis, Verbank, NY (US); Charles Jesse Taft, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/615,770

(22) Filed: Sep. 14, 2012

(65) Prior Publication Data
US 2013/0011936 A1    Jan. 10, 2013

Related U.S. Application Data

(63) Continuation of application No. 11/875,227, filed on Oct. 19, 2007, now Pat. No. 8,298,435.

(51) Int. Cl.
*B44C 1/22* (2006.01)
*C03C 25/68* (2006.01)
(Continued)

(52) U.S. Cl.
CPC .......... *H01L 21/31111* (2013.01); *C09K 13/04* (2013.01); *Y10T 137/0318* (2015.04)

(58) Field of Classification Search
CPC .............. H01L 21/31111; H01L 21/67086; H01L 21/67253; H01L 21/31105; H01L 21/3185; H01L 21/67075

USPC ............ 216/83, 95, 99, 93, 13, 2, 47, 96; 438/745, 757, 749, 8; 156/345.15, 156/345.18, 345.11, 345.24

See application file for complete search history.

(56) References Cited

U.S. PATENT DOCUMENTS

| | | | |
|---|---|---|---|
| 5,830,375 A | 11/1998 | Huang et al. | |
| 6,207,068 B1 | 3/2001 | Glick et al. | |

(Continued)

OTHER PUBLICATIONS

Microtech Systems ("Phosphoric Acid Nitride Removal", MT Systems Jun. 8, 2007).*

(Continued)

*Primary Examiner* — Nadine Norton
*Assistant Examiner* — Christopher Remavege
(74) *Attorney, Agent, or Firm* — Schmeiser, Olsen & Watts, LLP

(57) ABSTRACT

An etching method. The method includes etching a first plurality of silicon wafers in a first enchant, each silicon wafer having $SiO_2$ and $Si_3N_4$ deposited thereon, where the etching includes dissolving a quantity of the $SiO_2$ and a quantity of the $Si_3N_4$ in the first etchant. A quantity of insoluble $SiO_2$ precipitates. A ratio of a first etch rate of $Si_3N_4$ to a first etch rate of $SiO_2$ is determined to be less than a predetermined threshold. A portion of the first etchant is combined with a second etchant to form a conditioned etchant. A second plurality of silicon wafers is etched in the conditioned etchant. A ratio of a second etch rate of $Si_3N_4$ to a second etch rate of $SiO_2$ in the conditioned etchant is greater than the threshold. A method for exchanging an etching bath solution and a method for forming a selective etchant are also disclosed.

20 Claims, 4 Drawing Sheets

(51) Int. Cl.
*H01L 21/311* (2006.01)
*C09K 13/04* (2006.01)

(56) References Cited

U.S. PATENT DOCUMENTS

| | | | |
|---|---|---|---|
| 6,245,681 B1 | 6/2001 | Shields | |
| 6,326,313 B1 | 12/2001 | Couteau et al. | |
| 6,749,716 B2 | 6/2004 | Ottow et al. | |
| 7,591,959 B2 * | 9/2009 | Li et al. | 216/99 |
| 7,910,014 B2 * | 3/2011 | Yu et al. | 216/84 |
| 8,105,851 B1 * | 1/2012 | Ku et al. | 438/8 |
| 8,298,435 B2 * | 10/2012 | Arndt et al. | 216/84 |
| 2004/0200806 A1 | 10/2004 | Izuta et al. | |
| 2004/0253830 A1 | 12/2004 | Chang | |
| 2005/0067101 A1 | 3/2005 | Funabashi | |
| 2006/0011586 A1 * | 1/2006 | Shea | 216/95 |
| 2006/0057849 A1 * | 3/2006 | Yim | 438/689 |
| 2008/0035609 A1 * | 2/2008 | Kashkoush et al. | 216/84 |
| 2008/0066863 A1 | 3/2008 | Kiyose et al. | |
| 2008/0179293 A1 | 7/2008 | Wei et al. | |
| 2008/0203060 A1 * | 8/2008 | Hara et al. | 216/99 |
| 2008/0210900 A1 * | 9/2008 | Wojtczak et al. | 252/79.3 |
| 2009/0101626 A1 | 4/2009 | Arndt et al. | |

OTHER PUBLICATIONS

Office Action (Mail Date Aug. 18, 2010) for U.S. Appl. No. 11/875,227.
Amendment filed Nov. 18, 2010 in response to Office Action (Mail Date Aug, 18, 2010) for U.S. Appl. No. 11/875,227.
Final Office Action (Mail Date Jan. 26, 2011) for U.S. Appl. No. 11/875,227.
Amendment After Final filed Mar. 24, 2011 in response to Final Office Action (Mail Date Jan. 26, 2011) for U.S. Appl. No. 11/875,227.
Advisory Action (Mail Date Apr. 18, 2011) for U.S. Appl. No. 11/875,227.
Supplemental Amendment filed Apr. 26, 2011 in response to Final Office Action (Mail Date Jan. 26, 2011) for U.S. Appl. No. 11/875,227.
Final Office Action (Mail Date Jul. 1, 2011) for U.S. Appl. No. 11/875,227.
Amendment After Final filed Sep. 1, 2011 in response to Final Office Action (Mail Date Jul. 1, 2011) for U.S. Appl. No. 11/875,227.
Advisory Action (Mail Date Sep. 23, 2011) for U.S. Appl. No. 11/875,227.
Office Action (Mail Date Nov. 9, 2011) for U.S. Appl. No. 11/875,227.
Amendment filed Feb. 8, 2012 in response to Office Action (Mail Date Nov. 9, 2011) for U.S. Appl. No. 11/875,227.
Final Office Action (Mail Date Apr. 30, 2012) for U.S. Appl. No. 11/875,227.
Amendment After Final field Jun. 4, 2012 in response to Final Office Action (Mail Date Apr. 30, 2012) for U.S. Appl. No. 11/875,227.
Notice of Allowance (Mail Date Jun. 22, 2012) for U.S. Appl. No. 11/875,227.

* cited by examiner

SELECTIVE ETCHING BATH METHODS

This application is a continuation application claiming priority to Ser. No. 11/875,227, filed Oct. 19, 2007, now U.S. Pat. No. 8,298,435, issued Oct. 30, 2012.

FIELD OF THE INVENTION

The invention relates to semiconductor etching bath methods, materials, and systems.

BACKGROUND OF THE INVENTION

Phosphoric acid may be used as an etchant in semiconductor processing to selectively etch silicon nitride over silica from silicon process wafers. A build up of dissolved silica in the phosphoric acid etch bath from the etching of wafers, may inhibit further etching of silica from the wafer and thus increase the selectivity of the etchant. However, as the silica content of the etchant bath reaches saturation concentrations, the build up of solid silica precipitate may require the complete exchange of etchant from the bath system to avoid damaging pumps, filters, and other components. Replacement of the phosphoric acid in the bath with fresh acid requires a "seasoning" period to bring the silica concentration in solution back up to levels associated with high selectivity, where during this "seasoning" period the etch bath has low selectivity and thus low efficiency for etching silicon nitride. The use of purchased "preseasoned" acid solutions is costly in terms of both materials and the increased complexity of separate handling equipment. There exists a need for a cost effective method for replenishing etching baths with minimal impact on process complexity.

SUMMARY OF THE INVENTION

The present invention relates to an etching method, comprising:
etching a first plurality of silicon wafers in a first enchant, each silicon wafer of said first plurality of silicon wafers having $SiO_2$ and $Si_3N_4$ deposited thereon, wherein said etching comprises dissolving a quantity of said $SiO_2$ and a quantity of said $Si_3N_4$ in said first etchant and a quantity of insoluble $SiO_2$ precipitates in said first etchant in response to said dissolving;
after said etching, determining that a ratio of a first etch rate of $Si_3N_4$ to a first etch rate of $SiO_2$ from said first plurality of silicon wafers in said first etchant is less than a predetermined threshold;
in response to said determining and after said etching, combining a portion of said first etchant with a second etchant to form a conditioned etchant, wherein said portion is essentially free of insoluble $SiO_2$; and
after said combining, etching in said conditioned etchant a second plurality of silicon wafers having $SiO_2$ and $Si_3N_4$ disposed thereon, wherein a ratio of a second etch rate of $Si_3N_4$ to a second etch rate of $SiO_2$ from said second plurality of silicon wafers in said conditioned etchant is greater than said predetermined threshold.

The present invention relates to a method for forming a selective etchant, comprising:
etching a quantity of $SiO_2$ and a quantity of $Si_3N_4$ from a substrate in a first etchant, said etching comprising dissolving said quantity of $SiO_2$ and said quantity of $Si_3N_4$ in said first etchant;
determining a ratio of an etch rate of $Si_3N_4$ to an etch rate of $SiO_2$ from said substrate in said first etchant, based on said etching;
determining that said ratio is less than a predetermined threshold; and
in response to said determining that said ratio is less than said predetermined threshold, combining a second etchant with a portion of said first etchant to form a selective etchant, said first etchant having said quantity of $SiO_2$ and said quantity of $Si_3N_4$ dissolved therein, wherein said portion is in a sufficient amount such that said selective etchant selectively etches $Si_3N_4$ over $SiO_2$ in a ratio greater than said predetermine threshold.

The present invention relates to a method for exchanging an etching bath solution, comprising:
providing an etching system comprising an etching bath having a first etchant disposed therein, a receiving tank connected to said etching bath and configured to collect said first etchant transferred from said bath;
etching $Si_3N_4$ and $SiO_2$ from at least one substrate into said first etchant, said etching comprising dissolving said $SiO_2$ and said $Si_3N_4$ in said first etchant;
determining that an etching rate ratio of $Si_3N_4$ to $SiO_2$ from said at least one substrate in said first etchant is below a threshold value;
in response to said determining, transferring said first etchant from said bath to said receiving tank;
after said transferring said first etchant, adding a second etchant to said bath; and
transferring a portion of said first etchant from said receiving tank to said bath, said portion mixing with said second etchant in said bath, said first etchant having said $Si_3N_4$ and said $SiO_2$ dissolved therein.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
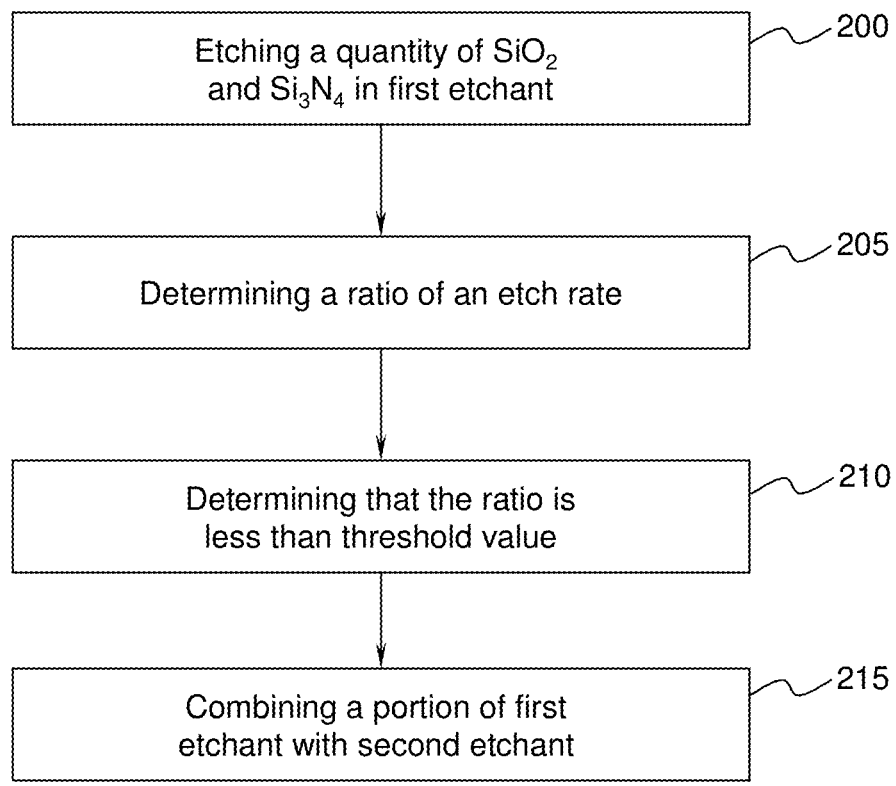
FIG. 1 is a flow chart illustrating a method for forming a selective etchant, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings.

Although the drawings are intended to illustrate the present invention, the drawings are not necessarily drawn to scale.

FIG. 1 is a flow chart illustrating a method for forming a selective etchant. Step 200 comprises etching a quantity of silica ($SiO_2$) and a quantity of silicon nitride ($Si_3N_4$) from a substrate in a first etchant where the etching comprises dissolving the quantity of silica and the quantity of silicon nitride in the first etchant.

The etchants in embodiments described herein may comprise a liquid etchant, such as a liquid acidic etchant, such as concentrated phosphoric acid, where the concentration of acid in the etchant may be greater than about 85% by weight, such as between about 85% and about 95%. The etchant may be heated such that the etchant is at a temperature between about 100° C. to about 165° C. during the etching in step 200.

The substrate may have silica and silicon nitride disposed thereon, such as in the form of layers, for example. The substrate may comprise multiple layers or the substrate may comprise a single layer. The substrate may consist essentially of silica and silicon nitride. The substrate may include a semiconducting material, an insulating material, a conductive material or any combination thereof, including multilayered structures. Thus, for example, the substrate may comprise a semiconducting material such as Si, SiGe, SiGeC, SiC, GaAs, InAs, InP and other III/V or II/VI compound semiconductors. The substrate may comprise, for example, a silicon wafer or process wafer such as that produced in various steps of a semiconductor manufacturing process, such as an integrated semiconductor wafer. The substrate may comprise a layered substrate such as, for example, Si/SiGe, Si/SiC, silicon-on-insulators (SOIs) or silicon germanium-on-insulators (SGOIs). The substrate may comprise layers such as a dielectric layer, a barrier layer for copper such as SiC, a metal layer such as copper, a silicon layer, a silicon oxide layer, the like, or combinations thereof. The substrate may comprise an insulating material such as an organic insulator, an inorganic insulator or a combination thereof including multilayers. The substrate may comprise a conductive material, for example, polycrystalline silicon (polySi), an elemental metal, alloys of elemental metals, a metal silicide, a metal nitride, or combinations thereof, including multilayers. The substrate may comprise ion implanted areas, such as ion implanted source/drain areas having P-type or N-type diffusions active to the surface of the substrate.

In some embodiments, the substrate may include a combination of a semiconducting material and an insulating material, a combination of a semiconducting material and a conductive material or a combination of a semiconducting material, an insulating material and a conductive material. An example of a substrate that includes a combination of the above is an interconnect structure.

Step 205 comprises determining a ratio of an etch rate of $Si_3N_4$ to an etch rate of $SiO_2$ from the substrate in the first etchant, based on the etching performed in step 200. The etch rate of $Si_3N_4$ and the etch rate of $SiO_2$ from the substrate may be determined experimentally, for example, by measuring the time in the etchant and measuring the thickness change in $Si_3N_4$ and $SiO_2$ on the substrate and determining the thickness change as a function of time. A high etching selectivity for $Si_3N_4$ over $SiO_2$ is indicated by a high etch rate ratio of $Si_3N_4$ to $SiO_2$. For example, a high selectivity may be indicated by an etch rate ratio greater than about 50:1, such as when an etch rate of $SiO_2$ is less than about 1 angstrom/minute (Å/min) and an etch rate of $Si_3N_4$ is greater than about 50 Å/min. In one embodiment, the etch rate ratio of $Si_3N_4$ to $SiO_2$ may be in a range from about 50:1 to about 200:1.

The etch rate ratio may initially be low when first etching the substrate in an etchant essentially free of $SiO_2$. For example, when etching a substrate having $Si_3N_4$ and $SiO_2$ disposed on the substrate, where the etchant is concentrated phosphoric acid such as in semiconductor processing, initially the etch rate ratio may be low (such as below 50:1) until a sufficient concentration of $SiO_2$ dissolves into the etchant solution bringing the concentration of $SiO_2$ in solution to about saturation, thus inhibiting the dissolving of $SiO_2$ into solution and therefore inhibiting etching of $SiO_2$ in the etchant. This may be described as "seasoning" the first etchant, after which the etch rate ratio may stabilize between about 50:1 to about 200:1. For example, a sufficient concentration may be attained at approximately 400 wafer-minutes of etching, where a wafer-minute may be described as one wafer etched for one minute in the etchant.

Step 210 comprises determining that the ratio determined in step 205 is less than a predetermined threshold. The determining of step 210 may be performed when the etch rate ratio has first stabilized, as described above, and then drops below the threshold as more $SiO_2$ dissolves in the etchant. The predetermined threshold may be about 50:1, for example. A decrease in the ratio to a value below the predetermined threshold may indicate an increasing concentration of $Si_3N_4$ and/or $SiO_2$ dissolved in the etchant, where high concentrations of $SiO_2$ may cause precipitation of solid $SiO_2$.

Step 215, in response to determining in step 210 that the ratio is less than the predetermined threshold, combines a second etchant with a portion of the first etchant to form a selective etchant, said first etchant having said quantity of $SiO_2$ and said quantity of $Si_3N_4$ dissolved therein, wherein said portion is in a sufficient amount such that said selective etchant selectively etches $Si_3N_4$ over $SiO_2$ in a ratio greater than said predetermine threshold. The selective etchant may comprise between about 1% and about 30% of the first etchant by volume. The addition of the portion of the first etchant into the second etchant may "preseason" the second etchant and stabilize the etch rate ratio above about 50:1 in the resulting selective etchant, since adding the portion adds a dissolved quantity of $Si_3N_4$ and $SiO_2$.

The first etchant and the second etchant may each comprise a liquid acidic etchant, such as phosphoric acid. The second etchant may be essentially free of $SiO_2$ before adding the portion of the first etchant to the second etchant.

Figure 2:
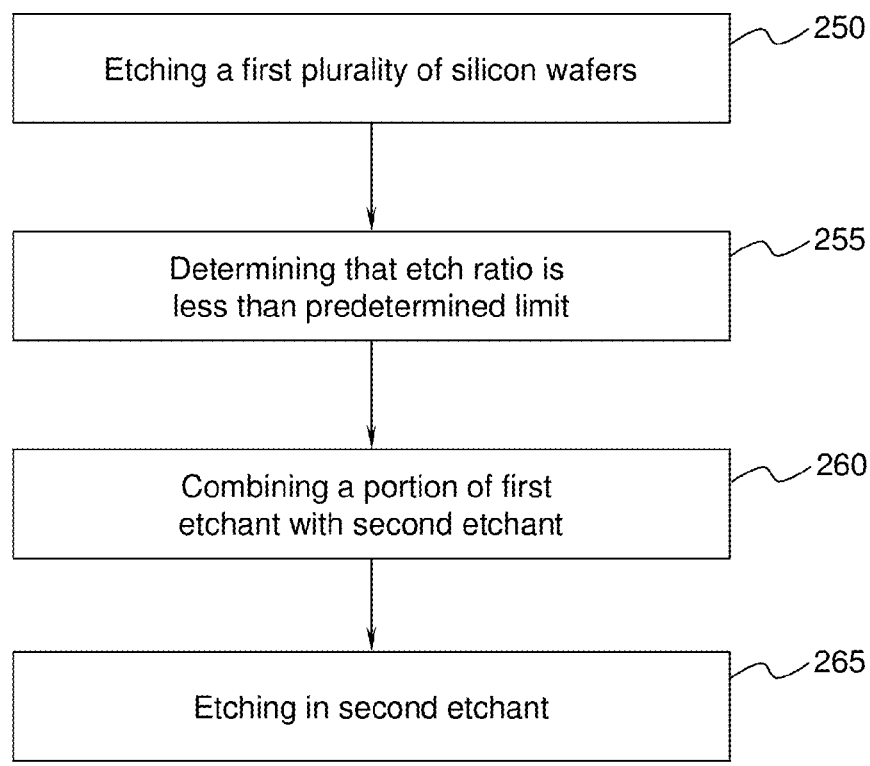
FIG. 2 is a flow chart illustrating an example of an embodiment of an etching method, in accordance with embodiments of the present invention.

FIG. 2 is a flow chart illustrating an example of an embodiment of an etching method. Step 250 includes etching a first plurality of silicon wafers in a first enchant. Each silicon wafer of said first plurality of silicon wafers may have $SiO_2$ and $Si_3N_4$ deposited thereon. The etching may comprise dissolving a quantity of the $SiO_2$ and a quantity of the $Si_3N_4$ in the first etchant from each of the plurality of wafers. A quantity of insoluble $SiO_2$ may precipitate in the first etchant in response to dissolving the $SiO_2$ in the etchant.

For example, the plurality of silicon wafers may be silicon semiconductor process wafers having at least one layer of $Si_3N_4$ and at least one layer of $SiO_2$ disposed on the wafer. The plurality of wafers may be etched in the etchant which may be concentrated phosphoric acid, for example. A sufficient quantity of wafers for a sufficient quantity of time may etch enough $SiO_2$ such that $SiO_2$ begins to precipitate out of solution. For example, etching for greater than 20,000 wafer-minutes may produce $SiO_2$ precipitate in the etchant.

Step 255 comprises determining, after the etching of step 250, that a ratio of a first etch rate of $Si_3N_4$ to a first etch rate of $SiO_2$ from said first plurality of silicon wafers in said first etchant is less than a predetermined threshold. As described above for the steps of FIG. 1, the etch rate ratio for $Si_3N_4$ and $SiO_2$ may decrease as $SiO_2$ and $Si_3N_4$ are dissolved in the first etchant, where the etch rate ratio may be determined experimentally from the etching of the plurality of silicon wafers. The ratio may drop below a predetermined limit or threshold, such as below 50:1, where the selectivity may be too low to continue processing additional silicon wafers at a desired level of efficiency. For example, the etch rate of $Si_3N_4$ may be less than about 50 Å/min. and/or an etch rate of $SiO_2$ may be greater than about 1 Å/min.

Step 260 comprises, in response to the determining of step 255 and after the etching of step 250, combining a portion of the first etchant with a second etchant to form a conditioned etchant. The conditioned etchant may comprise between about 1% and about 30% of the first etchant. The portion of the first etchant may be essentially free of solid $SiO_2$. For example, the portion of the first etchant may be siphoned off from the bulk of the first etchant such that precipitated (solid) $SiO_2$ is not extracted into the portion of the first etchant. The portion of the first etchant may thus comprise dissolved $SiO_2$ and $Si_3N_4$ without insoluble $SiO_2$. Combining the portion of the first etchant having dissolved $SiO_2$ and $Si_3N_4$ with a second etchant may immediately form a conditioned etchant capable of etching silicon wafers at an etch rate ratio above the predetermined threshold.

Step 265 comprises, after the combining of step 260, etching in the conditioned etchant a second plurality of silicon wafers having $SiO_2$ and $Si_3N_4$ disposed thereon, wherein a ratio of a second etch rate of $Si_3N_4$ to a second etch rate of $SiO_2$ from said second plurality of silicon wafers in said conditioned etchant is greater than said predetermined threshold. The first etchant and the second may each comprise a liquid acidic etchant, such as phosphoric acid. The second etchant may be essentially free of $SiO_2$ before adding the portion of the first etchant to the second etchant. For example, for a silicon semiconductor etching process, conditioned phosphoric acid etchant may be used for continued etching of wafers after combining the portion of the first phosphoric acid having $SiO_2$ and $Si_3N_4$ dissolved therein, with a fresh amount of phosphoric acid essentially free of $SiO_2$, to form the conditioned etchant.

Figure 3:
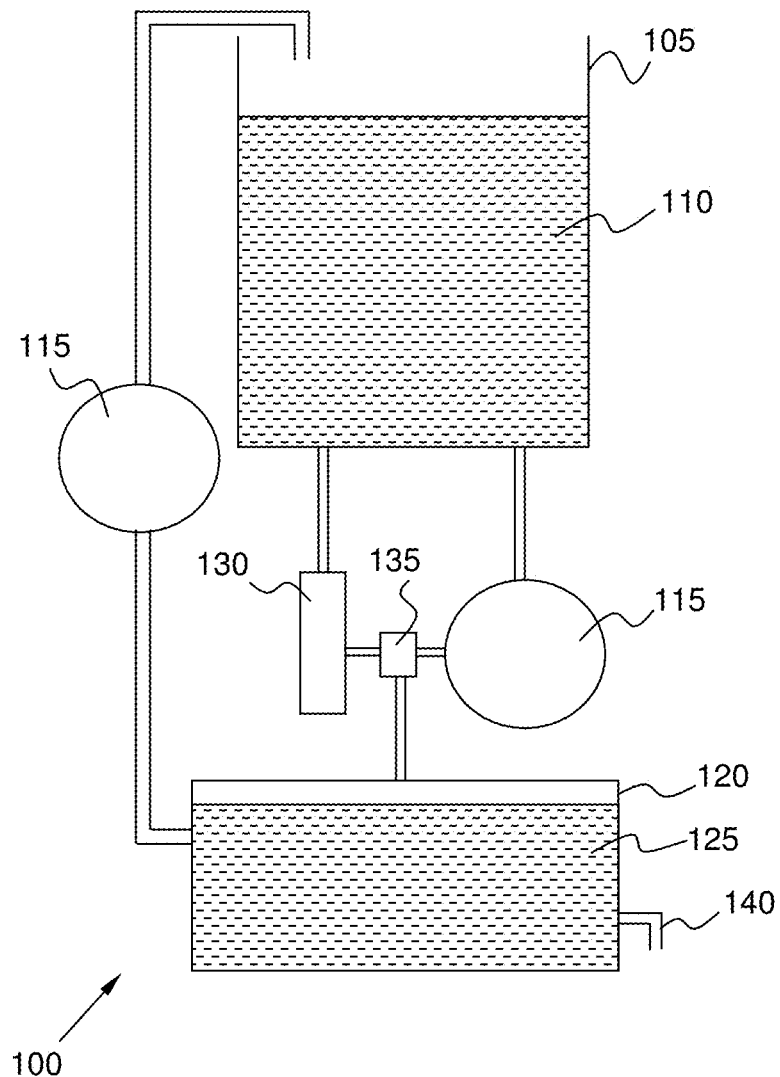
FIG. 3 is an illustration of an etching system comprising an etching bath having an etchant disposed therein, in accordance with embodiments of the present invention.

FIG. 3 is an illustration of an etching system 100 comprising an etching bath 105 having an etchant 110 disposed therein. The etching system 100 may comprise a receiving tank 120 connected to the etching bath 105, where the receiving tank 120 may be configured to collect drained etchant 125 such as the etchant 110 which may be drained or transferred from the bath 105. The etching system 100 may comprise at least one pump 115 operably attached to the receiving tank 120 and to the etching bath 105. The at least one pump 115 may be configured to transfer the etchant 125 from the receiving tank 120 to the bath 105, and may be configured to pump the etchant 110 from the bath 105 to the receiving tank 120 such as when the bath 105 is being drained. The etching system may further comprise at least one valve 135 configured to direct the flow of etchant 110, such as while it is drained from the bath 105, or as it is circulated through at least one filter 130 and returned to the bath 105. The etching system 100 may comprise a drain 140 through which etchant may be removed and disposed of.

Figure 4:
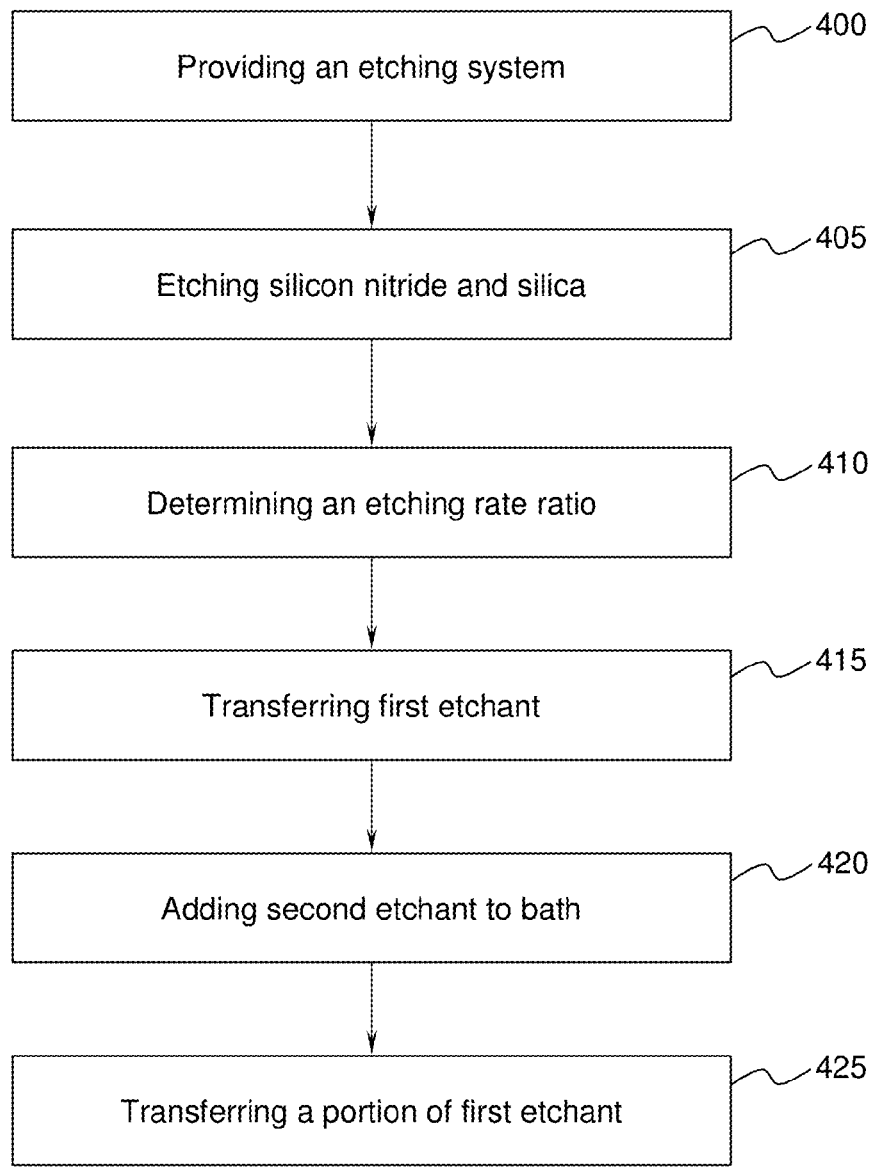
FIG. 4 is a flow chart illustrating an example of a method for exchanging an etching bath solution, in accordance with embodiments of the present invention.

FIG. 4 is a flow chart illustrating an example of a method for exchanging an etching bath solution. Step 400 comprises providing an etching system comprising an etching bath having a first etchant disposed therein, a receiving tank connected to said etching bath and configured to collect said first etchant transferred from said bath. For example, the etching system may comprise the etching system 100 illustrated in FIG. 3 and described above. The first etchant may comprise an acidic etchant, such as concentrated phosphoric acid. The first etchant may be at a temperature between about 100° C. and about 165° C. in the bath.

Step 405 comprises etching $Si_3N_4$ and $SiO_2$ from at least one substrate into said first etchant, said etching comprising dissolving said $SiO_2$ and said $Si_3N_4$ in said first etchant. The substrate may be as described above where, for example, the substrate may be a plurality of silicon process wafers.

Step 410 comprises determining that an etching rate ratio of $Si_3N_4$ to $SiO_2$ from said at least one substrate in said first etchant is below a threshold value, where the etching rate ratio is the ratio of the etching rate of $Si_3N_4$ to the etching rate of $SiO_2$ in the first etchant. Determining such an etch rate ratio may be as described above where, for example, the threshold value may be about 50:1, where the $Si_3N_4$ etched from the substrate in step 405 may be etched at an etch rate below about 50 Å/min, where the $SiO_2$ etched from the substrate in step 405 may be etched at an etch rate above about 1 Å/min.

Step 415 comprises, in response to determining of step 410, transferring the first etchant from the bath to the receiving tank. The receiving tank may be configured to cool or heat the drained etchant in order to change the etchant's temperature to a previously determined temperature. For example, for a phosphoric acid etchant in a bath maintained in a temperature range between about 100° C. and about 165° C., the drained etchant may be cooled to below 100° C. such as ambient temperature, or may be maintained within the temperature range of the bath.

Step 420 adds a second etchant to the bath after transferring the first etchant to the receiving tank in step 415. The second etchant may comprise an acidic etchant such as concentrated phosphoric acid and may be essentially free of $SiO_2$.

Step 420 transfers a portion of the first etchant having the $Si_3N_4$ and the $SiO_2$ dissolved therein, from the receiving tank to the bath, where the portion mixes with the second etchant added to the bath in step 420. The transferring may comprise pumping the portion of the first etchant using the pump described above and illustrated in FIG. 3. Mixing the portion of the first etchant with the second etchant in the bath may form a final volume of etchant, where the portion of the first etchant is between about 1% and about 30% of the final volume of etchant.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A method for forming a selective etchant, comprising:
    etching a quantity of $SiO_2$ and a quantity of $Si_3N_4$ from a substrate in a first etchant, said etching comprising dissolving said quantity of $SiO_2$ and said quantity of $Si_3N_4$ in said first etchant, wherein a quantity of insoluble $SiO_2$ precipitates in said first etchant in response to said dissolving;
    experimentally determining an etch rate of $Si_3N_4$ in said first etchant;
    experimentally determining an etch rate of $SiO_2$ in said first etchant;
    determining a ratio of an etch rate of $Si_3N_4$ to an etch rate of $SiO_2$ in said first etchant from the experimentally determined etch rate of $Si_3N_4$ in said first etchant and the experimentally determined etch rate of $SiO_2$ in said first etchant;

determining that said ratio is less than a predetermined threshold of at least 50:1; and in response to said determining that said ratio is less than said predetermined threshold, combining a second etchant with a portion of said first etchant to form a selective etchant, said first etchant having said quantity of $SiO_2$ and said quantity of $Si_3N_4$ dissolved therein, wherein said portion is in a sufficient amount such that said selective etchant selectively etches $Si_3N_4$ over $SiO_2$ in a ratio greater than said predetermined threshold.

2. The method of claim 1, wherein said second etchant is essentially free of $SiO_2$.

3. The method of claim 1, wherein said first etchant and said second etchant each comprise phosphoric acid.

4. The method of claim 1, wherein said selective etchant comprises between about 1% and about 30% of said first etchant by volume.

5. A method for exchanging an etching bath solution, comprising:

providing an etching system comprising an etching bath having a first etchant disposed therein, a receiving tank connected to said etching bath and configured to collect said first etchant transferred from said bath;

etching $Si_3N_4$ and $SiO_2$ from at least one substrate into said first etchant, said etching comprising dissolving said $SiO_2$ and said $Si_3N_4$ in said first etchant, wherein a quantity of insoluble $SiO_2$ precipitates in said first etchant in response to said dissolving;

experimentally determining an etch rate of $Si_3N_4$ in said first etchant;

experimentally determining an etch rate of $SiO_2$ in said first etchant;

determining a ratio of an etch rate of $Si_3N_4$ to an etch rate of $SiO_2$ in said first etchant from the experimentally determined etch rate of $Si_3N_4$ in said first etchant and the experimentally determined etch rate of $SiO_2$ in said first etchant;

determining that said ratio is below a predetermined threshold value of at least 50:1;

in response to said determining that said ratio is less than said predetermined threshold value, transferring said first etchant from said bath to said receiving tank;

after said transferring said first etchant, adding a second etchant to said bath; and after said adding said second etchant, transferring a portion of said first etchant from said receiving tank to said bath, said portion mixing with said second etchant in said bath, said first etchant having said $Si_3N_4$ and said $SiO_2$ dissolved therein.

6. The method of claim 5, wherein said first etchant and said second etchant each comprise phosphoric acid.

7. The method of claim 5, wherein said transferring the portion of said first etchant is performed after said adding the second etchant is performed.

8. The method of claim 5, wherein said transferring the portion of said first etchant comprises transferring the portion of said first etchant from said receiving tank into a valve and then into a pump and then into said bath.

9. The method of claim 5, wherein said transferring the portion results in said portion mixing in said bath with said second etchant to form in said bath a final volume of etchant consisting of said portion and said second etchant.

10. The method of claim 5, wherein said transferring the portion of said first etchant consists of transferring the portion of said first etchant from said receiving tank into a valve and then into a pump and then into said bath.

11. An etching method, comprising:

etching a first plurality of silicon wafers in a first etchant, each silicon wafer of said first plurality of silicon wafers having a first silica layer of $SiO_2$ and a first silicon nitride layer of $Si_3N_4$ deposited thereon, wherein said etching comprises dissolving a quantity of said $SiO_2$ from the first silica layer at a first etch rate of $SiO_2$ and a quantity of said $Si_3N_4$ from the first silicon nitride layer at a first etch rate of $Si_3N_4$ in said first etchant and a quantity of insoluble $SiO_2$ precipitates in said first etchant in response to said dissolving.

12. The method of claim 11, said method further comprising:

after said etching: determining a ratio of an etch rate of $Si_3N_4$ to an etch rate of $SiO_2$ from said first plurality of silicon wafers in said first etchant, and ascertaining that said determined ratio is less than a predetermined threshold; and in response to said ascertaining, combining a portion of said first etchant with a second etchant to form a conditioned etchant, wherein said portion is essentially free of insoluble $SiO_2$.

13. The method of claim 12, said method further comprising:

after said combining, etching in said conditioned etchant a second plurality of silicon wafers having a second silica layer comprising $SiO_2$ and a second silicon nitride layer comprising $Si_3N_4$ disposed thereon, wherein a ratio of a second etch rate of $Si_3N_4$ to a second etch rate of $SiO_2$ from said second plurality of silicon wafers in said conditioned etchant is greater than said predetermined threshold.

14. The method of claim 12, wherein said determining the ratio of an etch rate of $Si_3N_4$ to the etch rate of $SiO_2$ comprises determining the first etch rate of $SiO_2$, determining the first etch rate of $Si_3N_4$, and determining a ratio of the determined first etch rate of $Si_3N_4$ to the determined first etch rate of $SiO_2$; as being the wherein said determining the first etch rate of $SiO_2$ comprises measuring a $SiO_2$ thickness change of the first silica layer as a function of time and utilizing said measured $SiO_2$ thickness change of the first silica layer as a function of time to determine the first etch rate of $SiO_2$; and wherein said determining the first etch rate of $Si_3N_4$ comprises measuring a $Si_3N_4$ thickness change of the first silicon nitride layer as a function of time and utilizing said measured $Si_3N_4$ thickness change of the first silicon nitride layer as a function of time to determine the first etch rate of $Si_3N_4$.

15. The method of claim 12, wherein said second etchant is essentially free of $SiO_2$.

16. The method of claim 12, wherein said predetermined threshold is about 50:1.

17. The method of claim 12, wherein said first etchant and said second etchant each comprise phosphoric acid.

18. The method of claim 11, wherein each silicon wafer of said first plurality of silicon wafers consists essentially of the first silica layer of $SiO_2$ and the first silicon nitride layer of $Si_3N_4$ deposited thereon.

19. The method of claim 1, wherein said experimentally determining the etch rate of $Si_3N_4$ in said first etchant comprises measuring a thickness change in $Si_3N_4$ over time in said first etchant, followed by determining the etch rate of $Si_3N_4$ in said first etchant from the measured thickness change in $Si_3N_4$ over time in said first etchant, and
wherein said experimentally determining the etch rate of $SiO_2$ in said first etchant comprises measuring a thickness change in $SiO_2$ over time in said first etchant, followed by determining the etch rate of $SiO_2$ in said first etchant from the measured thickness change in $SiO_2$ over time in said first etchant.

20. The method of claim 5,
wherein said experimentally determining the etch rate of $Si_3N_4$ in said first etchant comprises measuring a thickness change in $Si_3N_4$ over time in said first etchant, followed by determining the etch rate of $Si_3N_4$ in said first etchant from the measured thickness change in $Si_3N_4$ over time in said first etchant, and
wherein said experimentally determining the etch rate of $SiO_2$ in said first etchant comprises measuring a thickness change in $SiO_2$ over time in said first etchant, followed by determining the etch rate of $SiO_2$ in said first etchant from the measured thickness change in $SiO_2$ over time in said first etchant.

* * * * *

UNITED STATES PATENT AND TRADEMARK OFFICE
CERTIFICATE OF CORRECTION

PATENT NO. : 9,177,822 B2  
APPLICATION NO. : 13/615770  
DATED : November 3, 2015  
INVENTOR(S) : Arndt et al.

It is certified that error appears in the above-identified patent and that said Letters Patent is hereby corrected as shown below:

In The Specification

Column 4, Line 47, delete "enchant" and replace with --etchant--

Column 8, Line 40, after "etch rate of $SiO_2$;" delete "as being the"

Signed and Sealed this
Twenty-second Day of March, 2016

Michelle K. Lee
*Director of the United States Patent and Trademark Office*